United States Patent [19]
Merrill

[11] Patent Number: 6,137,127
[45] Date of Patent: Oct. 24, 2000

[54] LOW LEAKAGE ACTIVE PIXEL USING SPACER PROTECTIVE MASK COMPATIBLE WITH CMOS PROCESS

[75] Inventor: Richard B. Merrill, San Mateo, Calif.

[73] Assignee: Foveonics, Inc., Cupertino, Calif.

[21] Appl. No.: 08/908,266

[22] Filed: Aug. 7, 1997

[51] Int. Cl.[7] ........................ H01L 31/062; H01L 27/148
[52] U.S. Cl. ........................ 257/292; 257/233; 257/290
[58] Field of Search .................................... 257/233, 290, 257/291, 292, 461

[56] References Cited

U.S. PATENT DOCUMENTS

| | | | |
|---|---|---|---|
| 4,742,025 | 5/1988 | Ohyu et al. | 437/225 |
| 5,342,798 | 8/1994 | Huang | 437/41 |
| 5,352,631 | 10/1994 | Sitaram et al. | 437/200 |
| 5,413,969 | 5/1995 | Huang | 437/200 |
| 5,625,210 | 4/1997 | Lee et al. | 257/233 |

*Primary Examiner*—Tom Thomas
*Assistant Examiner*—Ori Nadav
*Attorney, Agent, or Firm*—Limbach & Limbach L.L.P.

[57] ABSTRACT

A pixel cell structure having a nonsilicided photodiode overcomes problems associated with the absorption of incident light by silicided surfaces. Furthermore, a photodiode access transistor having a partially silicided gate is interposed between the photodiode and the pixel cell transistors performing reset and row select functions, thereby allowing isolation of the photodiode from leakage associated with silicided junctions. Selective application of voltage to the transistors of the pixel structure according to a clocking sequence permits interaction of the photodiode and the MOS transistors making up the pixel cell, while minimizing exposure of the photodiode to leakage and stress associated with these silicided MOS transistors.

3 Claims, 5 Drawing Sheets

LOW LEAKAGE ACTIVE PIXEL USING SPACER PROTECTIVE MASK COMPATIBLE WITH CMOS PROCESS

BACKGROUND OF THE INVENTION

1. Field of the Invention.

The present invention relates to pixel cells and, more particularly, to a pixel cell circuit having a nonsilicided photodiode region linked with a number of silicided MOS transistors by a photodiode access structure. Application of voltage to the photodiode access structure under a regular clocking schedule permits the photodiode to be selectively isolated and connected to the other elements of the pixel cell. Isolating the photodiode from the transistors in this manner shields the photodiode from leakage associated with silicided junctions, while permitting the photodiode to communicate voltage generated by incident light as an output of the pixel cell.

2. Description of the Related Art.

Recent imaging circuits use pixel cells to convert incident light energy into an electrical signal. In a typical pixel cell structure, a silicided photodiode is typically combined with a number of silicided MOS transistors which provide amplification, readout control, and reset control.

FIG. 1A shows a cross-sectional view of a conventional pixel cell. FIG. 1B shows a circuit diagram of the conventional pixel cell shown in FIG. 1A. As shown in FIG. 1A, a conventional pixel cell 110 includes a photodiode 111 and three MOS transistors: reset transistor 112, buffer transistor 113, and row select transistor 114. These conventional pixel cell circuit elements are arranged as described below:

Photodiode 111 is formed from the p/n junction between lightly doped P type substrate 115 and first heavily doped N region 116. First N+ region 116 has a silicided surface 117.

Reset transistor 112 has a source formed by photodiode 111 and a drain formed by second heavily doped N type region 118 connected to power supply node 119. Gate 120 of reset transistor 112 is connected to reset node 121.

Buffer transistor 113 shares with reset transistor 112 second N+ region 118 as a drain. The source of buffer transistor 113 is formed by third heavily doped N type region 122. Photodiode node 123 connects photodiode 111 with gate 124 of buffer transistor 113.

Row select transistor 114 has a source formed by fourth heavily doped N type region 125, which is connected to output node 126. Row select transistor 114 shares with buffer transistor 113 third N+ region 122 as a drain. Gate 127 of row select transistor 114 is connected to row select node 128. The gates, drains and sources of the MOS transistors making up pixel cell 110 all bear silicided surfaces 129.

Pixel cell 110 operates in three steps: a reset step, where the pixel cell is reset from the previous integration cycle; an image integration step, where light energy is collected by the photodiode and converted into an electrical signal; and a signal readout step, where the electrical signal is read out from the photodiode.

TABLE 1 shows a timing diagram illustrating reset, image integration, and readout steps with respect to conventional pixel cell 110.

TABLE 1

Timing Diagram For Conventional Pixel Cell

| time | step | λ-diode node | reset node | row select node | output node |
|---|---|---|---|---|---|
| $t_1$ | reset | $V_{fin}$ | high | low | low |
| $t_2$ | int. | $V_{init}$ | low | high | $V_{init}$ |
| $t_3$ | read | $V_{fin}$ | low | high | $V_{fin}$ |

With reference to FIGS. 1A–1B, the reset step begins by pulsing reset node 121 with a reset voltage at time $t_1$. The reset voltage turns on reset transistor 112, which pulls up the voltage on photodiode 111 and gate 124 of buffer transistor 113 to an initial integration voltage $V_{init}$. The voltage on the source of buffer transistor 113 is in turn pulled up to one threshold voltage drop below $V_{init}$, due to the source-follower operation of buffer transistor 113.

After this, the value of the initial integration voltage $V_{init}$ (less the threshold voltage drop of buffer transistor 113) of photodiode 111 is read out from the pixel cell circuit by pulsing gate 127 of row-select transistor 114 with a row select voltage at time $t_2$. The row select voltage turns on row select transistor 114, causing $V_{init}$ on the source of buffer transistor 113 to appear on the source of row select transistor 114, and on output node 126. $V_{init}$ may then be detected by conventional circuitry, and is stored as a reset value.

Next, during integration, light energy in the form of photons 130 strikes silicided surface 117 of photodiode 111, thereby creating a number of electron-hole pairs. Photodiode 111 is designed to limit recombination between these newly formed electron-hole pairs. As a result, the photogenerated holes are attracted to the ground terminal (not shown) of photodiode 111, while photogenerated electrons are attracted to the positive terminal of photodiode 111 where each additional electron reduces the voltage on photodiode 111.

Following image integration, the final integration voltage $V_{fin}$ is read out at time $t_3$. At this time, the final integration voltage $V_{fin}$ on photodiode 111 (less the threshold voltage of buffer transistor 113), is present on the source of row select transistor 114 due to the source-follower operation of buffer transistor 113. As a result, when a row select voltage is applied to row select node 128 at $t_3$ turning on row-select transistor 114, the final voltage $V_{fin}$ on the source of buffer transistor 113 appears on the source of row-select transistor 114 and output node 126. $V_{fin}$ is detected and then stored as a read value.

Thus, at the conclusion of the integration period, the number of photons absorbed by photodiode 111 during the image integration period can be determined from the difference between $V_{fin}$ (taken at the end of the integration period) and $V_{init}$ (taken at the beginning of the integration period). This voltage difference corresponds to the number of electron hole pairs generated on photodiode 111, and hence the amount of incident light energy.

Silicides, such those present on silicided surfaces 129 of pixel cell 110, are extremely useful for providing low impedance contacts between semiconductor devices. Introduction of silicides into a digital circuit thus considerably enhances speed and performance.

However, because silicides are formed from metals, their presence in an analog circuit can cause significant loss of signal integrity. Pixel cell 110 has a substantial analog character. In order to accurately portray the amount of incident light, $V_{init}$ and $V_{fin}$, generated on photodiode 111 must be communicated to output node 126 with minimal degradation. Thus, the presence of silicide layers 129 in pixel cell 110 can seriously degrade signal integrity, disrupting the operation of the circuit.

Other problems are associated with silicides as well. Silicided surface layer 117 of photodiode 111 absorbs most of the incident light falling on photodiode 111, reducing sensitivity. Moreover, leakage at silicided junctions (for example between silicided photodiode 111 and silicided gate 120 of reset transistor 112) is much higher than leakage with nonsilicided junctions. This leakage will effectively limit the signal to noise ratio of the pixel cell, reducing its usefulness in imagers in consumer applications.

Because of the light sensitivity and leakage problems described above, it is desirable to form a pixel cell structure wherein the photodiode surface remains nonsilicided, and moreover, the photodiode is not directly exposed to a silicided junction.

SUMMARY OF THE INVENTION

The present invention relates to a pixel cell circuit having a nonsilicided photodiode region coupled with a number of silicided MOS transistors. A partially silicided photodiode access structure is interposed between the photodiode and the other silicided MOS transistors. Application of voltage according to a clocking sequence to the partially silicided photodiode access structure and the silicided MOS transistors permits selective communication between the photodiode and the MOS transistors. This configuration minimizes exposure of the photodiode to leakage and stress associated with the silicided MOS transistors. The present invention also discloses a method of manufacturing the above-described pixel cell utilizing a spacer oxide masking process.

DETAILED DESCRIPTION

Figure 1A:
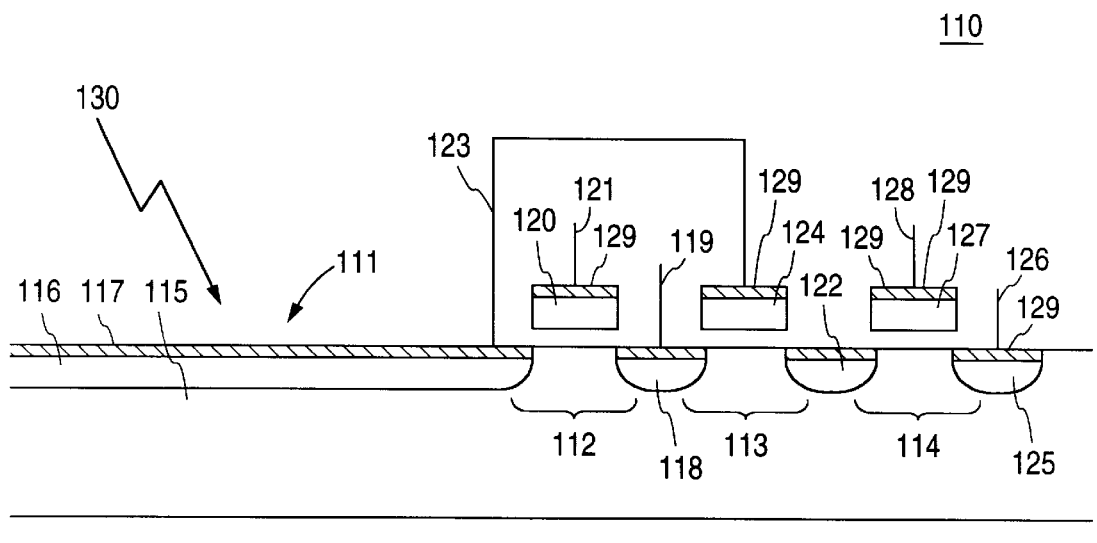
FIG. 1A shows cross-sectional view of a conventional pixel cell having a silicized photodiode region.
Figure 1B:
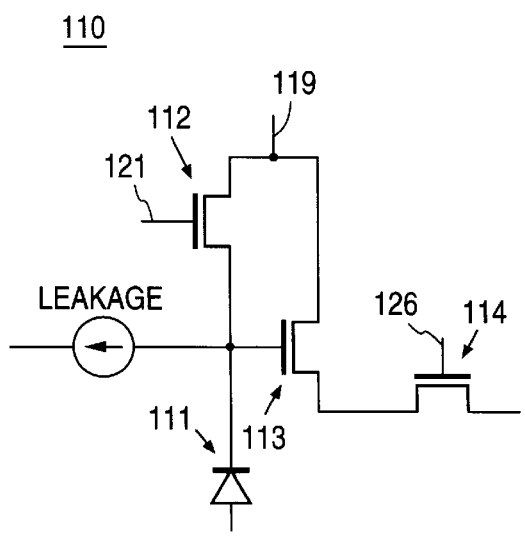
FIG. 1B shows a circuit diagram of the conventional pixel cell shown in FIG. 1A.
Figure 2A:
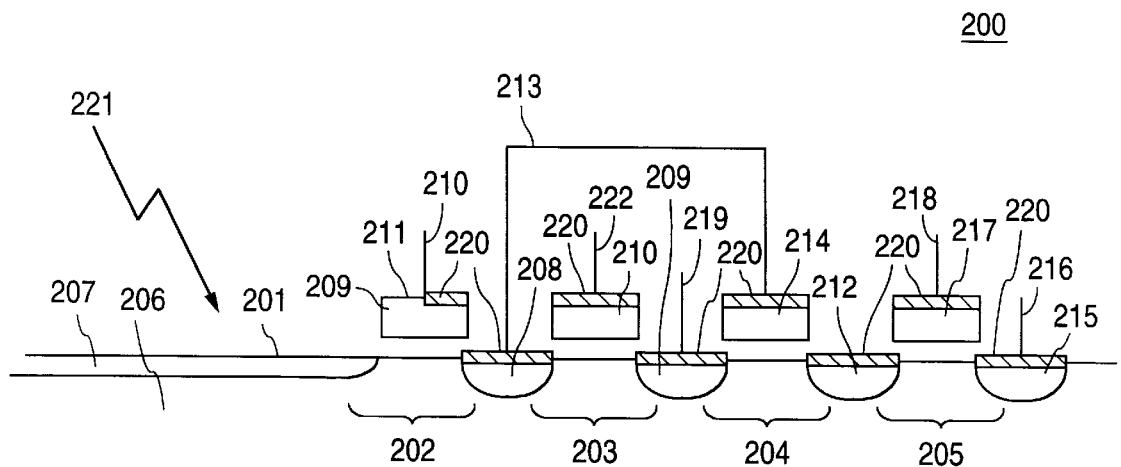
FIG. 2A shows a cross-sectional view of a pixel cell having a nonsilicided photodiode in accordance with one embodiment of the present invention.
Figure 2B:
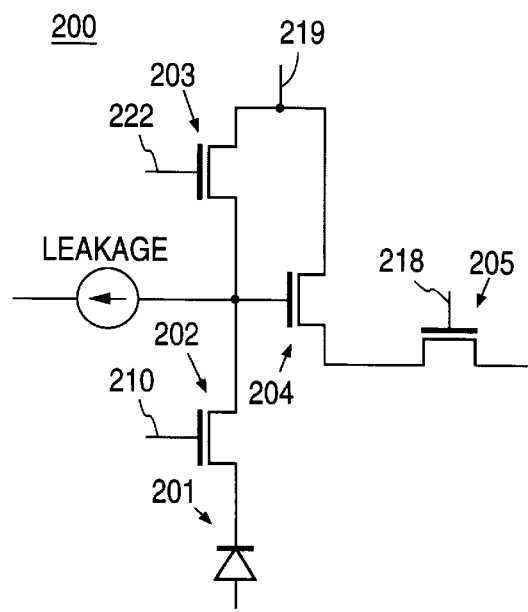
FIG. 2B shows a circuit diagram of the pixel cell shown in FIG. 2A.

FIG. 2A shows cross-sectional view of a pixel cell having a nonsilicided photodiode in accordance with one embodiment of the present invention. FIG. 2B shows a circuit diagram of the pixel cell shown in FIG. 2A. As shown in FIGS. 2A–2B pixel cell 200 is composed of a nonsilicided photodiode 201, and four silicided MOS transistor structures: photodiode access transistor 202; reset transistor 203, buffer transistor 204, and row select transistor 205. These pixel cell circuit elements are configured as described below.

Photodiode 201 is formed from the p/n junction between lightly doped P type substrate 206, and lightly doped N region 207.

Photodiode access transistor 202 has a source formed by photodiode 201, and a drain formed by first heavily doped N type region 208. Gate 209 of photodiode access transistor 202 is connected to photodiode access node 214. Surface region 211 of gate 209 proximate to photodiode 201 is free of silicides.

Reset transistor 203 shares with photodiode access transistor 202 first N+ region 208 as a source. The drain of reset transistor 203 is formed by second heavily doped N type region 209 having power supply node 219. Gate 210 of reset transistor 203 is connected to reset node 222.

Buffer transistor 204 shares with reset transistor 203 second N+ region 209 as a drain. The source of buffer transistor 204 is formed by third heavily doped N type region 212. Photodiode node 213 connects first N+ region 208 with gate 214 of buffer transistor 204.

Row select transistor 205 has a source formed by fourth heavily doped N type region 215, which is connected to output node 216. Row select transistor 205 shares with buffer transistor 204 third N+ region 212 as a drain. Gate 217 of row select transistor 205 is connected to row select node 218. With the exception of photodiode 201 and region 211 of gate 209, the gates, drains, and sources of the MOS transistors making up pixel cell 200 all bear silicided surfaces 220.

As with conventional pixel cell 100, pixel cell 200 operates in three discrete steps: a reset step, where pixel cell 200 is reset from the previous integration cycle; an image integration step, where light energy is collected by the photodiode and converted into an electrical signal; and a signal readout step, where the electrical signal is read out from the photodiode.

TABLE 2 shows a timing diagram illustrating reset, image integration, and readout steps with respect to pixel cell 200.

TABLE 2

Timing Diagram for Pixel Cell In
Accordance with the Present Invention

| time | step | λ-diode node | λ-diode access node | reset node | row select node | output node |
|---|---|---|---|---|---|---|
| $t_1$ | reset | $V_{fin}$ | high | high | low | low |
| $t_2$ | int. | $V_{init}$ | low | high | low | $V_{init}$ |
| $t_3$ | read | $V_{fin}$ | high | low | high | $V_{fin}$ |

With reference to FIGS. 2A–2B the reset step begins by pulsing photodiode access node 210 and reset node 222 with a reset voltage at time $t_1$. This reset voltage turns on both photodiode access transistor 202 and reset transistor 203. This pulls up the voltage on photodiode 201, photodiode access transistor 202, and reset transistor 203 to an initial integration voltage $V_{init}$. Voltage on the source of buffer transistor 204 is in turn pulled up to be one threshold voltage drop below the initial integration voltage $V_{init}$ on the gate of buffer transistor 204, due to source-follower operation of buffer transistor 204.

After this, the value of the initial integration voltage $V_{init}$ (less the threshold voltage drop of buffer transistor 204) of photodiode 201 is read out from the pixel cell circuit by pulsing gate 217 of row-select transistor 205 with a row-select voltage at time $t_2$. This row-select voltage turns on row-select transistor 205, causing $V_{init}$ on the source of buffer transistor 204 to appear on the source of row-select transistor 205, and output node 216. $V_{init}$ may then be detected by conventional circuitry, and then stored as a reset value.

Next, during integration, light energy in the form of photons 221 strikes the nonsilicided surface of photodiode 201, thereby creating a number of electron-hole pairs. Photodiode 201 is designed to limit recombination between the newly formed electron-hole pairs. As a result, the photogenerated holes are attracted to the ground terminal (not shown) of photodiode 201, while the photogenerated electrons are attracted to the positive terminal of photodiode 201 where each additional electron reduces the voltage on photodiode 201.

During integration, no voltage is applied to photodiode access node 210, and photodiode access transistor 202 is off. This isolates photodiode 201 from leakage associated with the silicided junction between photodiode 201 and gate 209.

However, during integration voltage is applied to reset node 222, thereby turning on reset transistor 203. This allows leakage associated with the silicided junction between N+ region 209 and reset node 222 to be directed to power supply node 219, where it is absorbed harmlessly.

Following image integration, the final integration voltage $V_{fin}$ is read out at time $t_3$. Photodiode access node 210 is pulsed with voltage, turning on photodiode access transistor 202. The potential found on photodiode 201 is then passed to gate 214 of buffer transistor 204.

At this time, the final integration voltage $V_{fin}$ on photodiode 201, less the threshold voltage of buffer transistor 204, is present on the source of row-select transistor 205 due to the source-follower operation of buffer transistor 204. As a result, when a row-select voltage is applied to row-select node 216 at $t_3$ turning on row-select transistor 205, the final voltage $V_{fin}$ on the source of buffer transistor 204 appears on the source of row select transistor 205 and output node 216. $V_{fin}$ is detected and then stored as a read value.

Thus, at the conclusion of the integration period, the number of photons absorbed by photodiode 201 during the image integration period can be determined from the difference between $V_{fin}$ (taken at the end of the integration period) and $V_{init}$ (taken at the beginning of the integration period). This voltage difference corresponds to a number of electron hole pairs generated on the photodiode, and hence the amount of incident light energy.

Pixel cell structure 200 offers several important advantages over conventional pixel cell structure 100. Photodiode 201 of pixel cell 200 is not exposed to a silicided junction. Rather, because region 211 of gate 209 proximate to photodiode 201 is free of silicides (due to specific fabrication steps discussed below in conjunction with FIG. 4) there is no silicided junction involving photodiode 201. The absence of silicides on both photodiode 201 and region 211 of photodiode access transistor 202 cures the sensitivity and leakage problems associated with conventional pixel cell 100.

Figure 3:
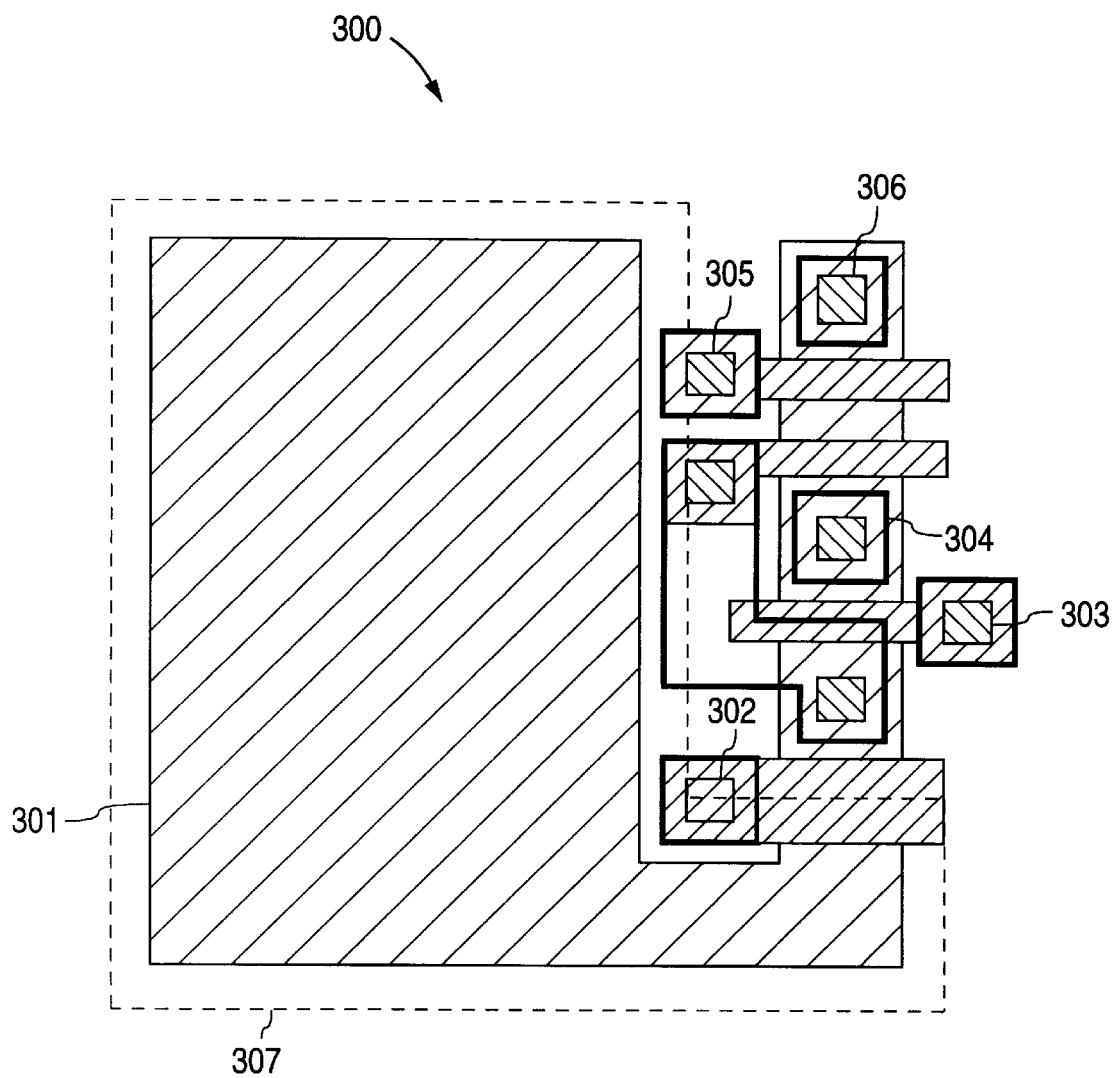
FIG. 3 shows a plan view of a pixel cell having a nonsilicided photodiode formed in accordance with one embodiment of the present invention.

FIG. 3 shows a plan view of pixel structure 300 having a nonsilicided photodiode. Pixel cell 300 includes nldd photodiode surface 301, photodiode access node 302, reset node 303, power supply node 304, row select node 305, and output node 306. This top view shows that the overall structure of pixel cell 300 is not overtly complex, even with addition of the "extra" photodiode access transistor having photodiode access node 302. The extent of the silicide exclusion photoresist mask 307 is also indicated in FIG. 3. This mask plays a key role in the fabrication of pixel cell 300, and is described in detail in connection with FIGS. 4A–4H.

FIGS. 4A–4H depicts process steps performed during fabrication of a pixel cell circuit in accordance with one embodiment of the present invention. Pixel cell 400 (identical to pixel structure 200 of FIG. 2A) is fabricated utilizing a spacer oxide masking technique, as illustrated in FIGS. 4A–4H.

Figure 4A:
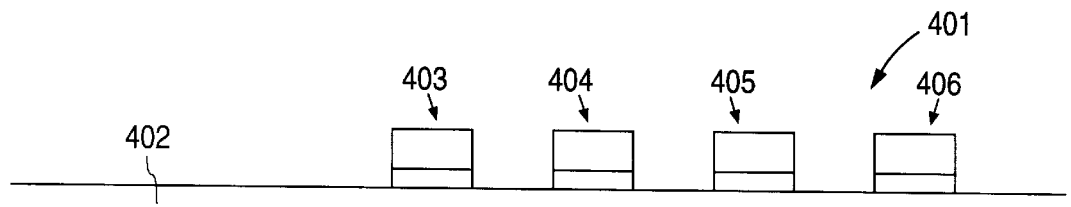
FIG. 4A–4H show cross-sectional views of the shows spacer oxide masking process steps leading to formation of pixel cell having a nonsilicided photodiode in accordance with one embodiment of the present invention.
Figure 4B:
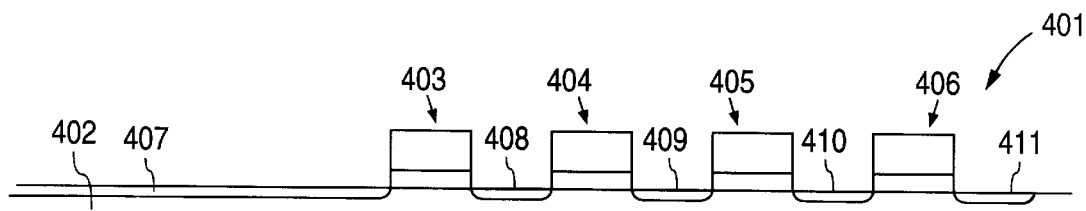

FIG. 4A shows precursor pixel cell structure 401 having lightly doped P type substrate 402 supporting gate structures 403, 404, 405, and 406. FIG. 4B shows implantation of N type dopant into precursor pixel cell 401, with gates 403, 404, 405 and 406 blocking implantation into the substrate, thereby forming self-aligned nldd regions 407, 408, 409, 410 and 411.

Figure 4C:
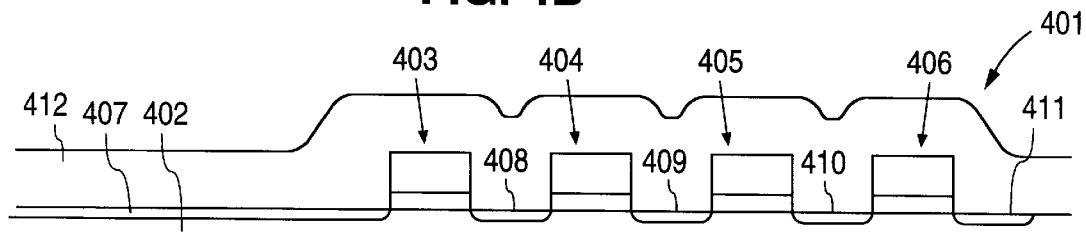
Figure 4D:
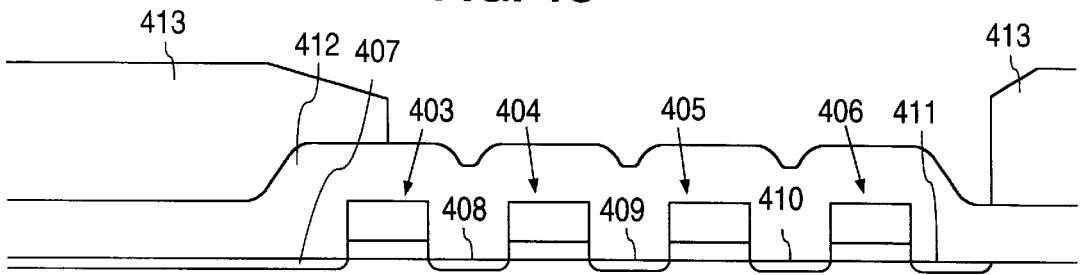

FIG. 4C shows deposition of spacer oxide layer 412 over the entire surface of precursor pixel cell 401. FIG. 4D shows the selective development of silicide exclusion photoresist mask 413 over regions to be protected from formation of silicides, specifically N type precursor photodiode 407, and region 414 of gate 403 proximate to precursor photodiode 407.

Figure 4E:
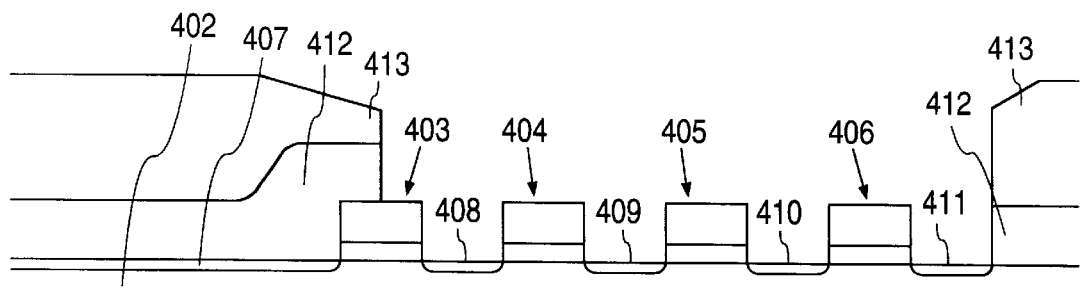
Figure 4F:
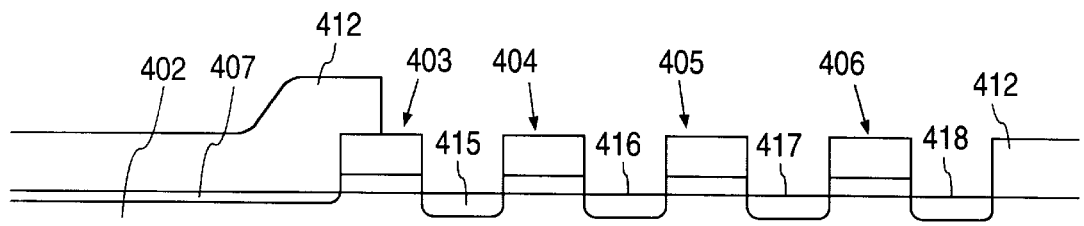

FIG. 4E shows partial etchback of spacer oxide layer 412, whereby the spacer oxide layer in regions not covered by silicide exclusion photoresist mask 413 is removed, exposing nldd regions 408, 409, 410, and 411, and gates 404, 405, 406, and (partially) 403. FIG. 4F shows removal of the silicide exclusion photoresist mask 413, followed by implantation of highly concentrated N type impurity into exposed nldd regions 408, 409, 410, and 411, forming first N+ region 415, second N+ region 416, third N+ region 417, and fourth N+ region 418.

Figure 4G:
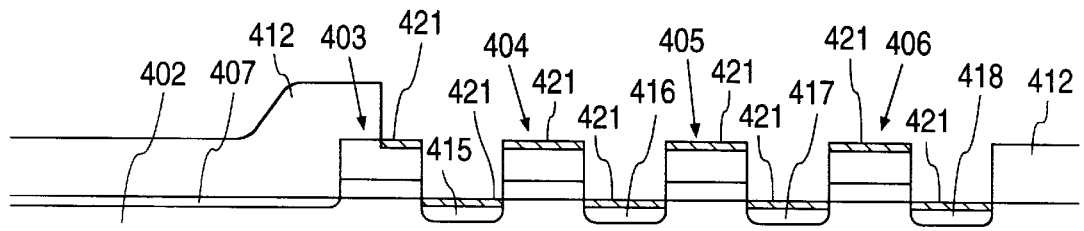
Figure 4H:
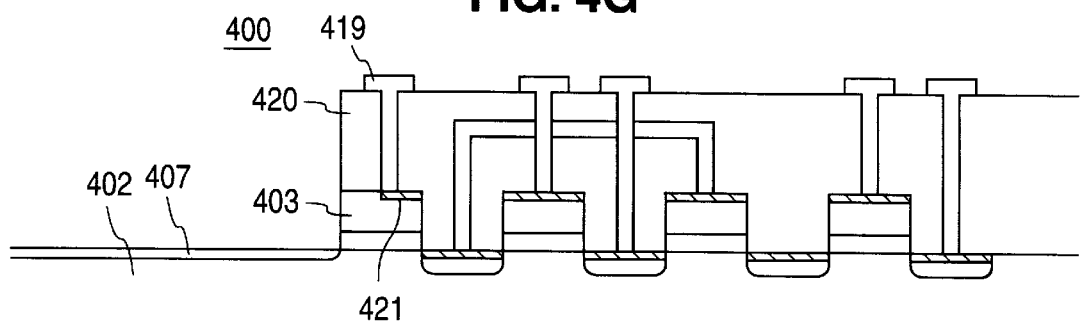

FIG. 4G shows formation of layers of refractory metal 421 upon exposed N+ regions 415, 416, 417 and 418, and gates 404, 405, 406 and (partially) 403. FIG. 4H shows removal of the spacer oxide layer over photodiode 401 and formation of metal contacts 419. Metal contacts 419 are separated from conducting regions of pixel cell 400 by non-conducting layer 420, completing fabrication of pixel cell 400.

It is important to note that pixel cell 200 having nonsilicided photodiode 201, and the process for forming this structure shown in FIGS. 4A–4H represent merely one embodiment of many such devices and processes in accordance with the present invention. Therefore, it is intended that the following claims define the scope of the invention, and that methods and structures within the scope of these claims and their equivalents be covered thereby.

What is claimed is:

1. A pixel cell for converting light into an output voltage, the pixel cell comprising:

a nonsilicided photodiode capable of generating a voltage upon exposure to incident light energy;

a silicided voltage transmission element capable of transmitting an input voltage to an output node, the voltage transmission element comprising, a reset transistor having silicided reset transistor gate, reset transistor drain, and reset transistor source regions, the reset transistor gate region connected to a reset node and the reset transistor drain region connected to a power supply, a buffer transistor configured in source follower mode with the reset transistor, the buffer transistor having silicided buffer transistor gate, buffer transistor drain, and buffer transistor source regions, the buffer transistor gate region connected to the photodiode access structure, and a row select transistor having silicided row select transistor gate, row select transistor drain, and row select transistor source regions, the row select transistor source region connected to an output node; and a photodiode access structure positioned between the photodiode and the voltage transmission element and selectively permitting the voltage generated by the photodiode to be transmitted to the voltage transmission element as an input voltage, the photodiode access structure comprising,
    a photodiode access transistor having the nonsilicided photodiode as a source, a partially silicided photodiode access transistor gate, and a silicided and heavily doped region as a photodiode access transistor drain, such that the photodiode, access transistor drain is connected to the buffer transistor gate.

2. A pixel cell for converting light into an output voltage, the pixel cell comprising:
    a photodiode including silicon of a first conductivity type formed within a silicon substrate of a second conductivity type;
    a photodiode access transistor including a source formed by the photodiode, a silicided drain formed by a first heavily doped silicided region of first conductivity type formed within the silicon substrate, and a partially silicided gate connected to a photodiode access node, such that the nonsilicided region of the partially silicided gate is adjacent to the photodiode;
    a reset transistor including a source formed by the first heavily doped silicided region, a drain formed by a second heavily doped silicided region of first conductivity type formed within the substrate and connected to a power supply, and a first silicided gate connected to a reset node;
    a buffer transistor including a source formed by a third heavily doped silicided region of first conductivity type formed within the substrate, a drain formed by the second heavily doped silicided region, and a second silicided gate connected to the first heavily doped silicided region; and
    a row select transistor including a source formed by a fourth heavily doped silicided region of first conductivity type formed within the substrate and connected to an output node, a drain formed by the third heavily doped region, and a third silicided gate connected to a row select node.

3. A pixel cell in accordance with claim 4 wherein the first conductivity type is n type and the second conductivity type is p type.

* * * * *